US011049691B2

(12) United States Patent
Koo et al.

(10) Patent No.: US 11,049,691 B2
(45) Date of Patent: Jun. 29, 2021

(54) ION BEAM QUALITY CONTROL USING A MOVABLE MASS RESOLVING DEVICE

(71) Applicant: Varian Semiconductor Equipment Associates, Inc., Gloucester, MA (US)

(72) Inventors: Bon-Woong Koo, Andover, MA (US); Robert C. Lindberg, Rockport, MA (US); Eric D. Hermanson, Georgetown, MA (US); Frank Sinclair, Boston, MA (US); Antonella Cucchetti, Manchester by the Sea, MA (US); Randy Martin, Haverhill, MA (US); Michael D. Johnson, Peabody, MA (US); Ana Samolov, Somerville, MA (US); Svetlana B. Radovanov, Brookline, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 229 days.

(21) Appl. No.: 15/850,184

(22) Filed: Dec. 21, 2017

(65) Prior Publication Data

US 2019/0198292 A1 Jun. 27, 2019

(51) Int. Cl.
*H01J 37/317* (2006.01)
*H01L 21/04* (2006.01)

(52) U.S. Cl.
CPC ...... *H01J 37/3171* (2013.01); *H01L 21/0415* (2013.01); *H01J 2237/04926* (2013.01); *H01J 2237/05* (2013.01); *H01J 2237/31713* (2013.01)

(58) Field of Classification Search
CPC ........... H01J 2237/0455; H01J 37/3171; H01J 37/147; H01J 2237/15; H01J 37/15;
(Continued)

(56) References Cited

U.S. PATENT DOCUMENTS 4,757,208 A * 7/1988 McKenna ........... H01J 37/3174
250/492.2
5,130,552 A 7/1992 Bright et al.
(Continued)

FOREIGN PATENT DOCUMENTS

CN 105247660 1/2016
KR 10-2015-0130557 A 11/2015
TW 200739648 A 10/2007

OTHER PUBLICATIONS

International Search Report and Written Opinion dated Feb. 13, 2019 in corresponding PCT application No. PCT/US2018/057287.

*Primary Examiner* — Brooke Purinton

(74) *Attorney, Agent, or Firm* — Nields, Lemack & Frame, LLC

(57) ABSTRACT

A system and method for optimizing a ribbon ion beam in a beam line implantation system is disclosed. The system includes a mass resolving apparatus having a resolving aperture, in which the resolving aperture may be moved in the X and Z directions. Additionally, a controller is able to manipulate the mass analyzer and quadrupole lenses so that the crossover point of desired ions can also be moved in the X and Z directions. By manipulating the crossover point and the resolving aperture, the parameters of the ribbon ion beam may be manipulated to achieve a desired result. Movement of the crossover point in the X direction may affect the mean horizontal angle of the beamlets, while movement of the crossover point in the Z direction may affect the horizontal angular spread and beam current.

11 Claims, 9 Drawing Sheets

(58) Field of Classification Search
CPC ............... H01J 2237/057; H01J 37/023; H01J 2237/04; H01J 2237/0458; H01J 2237/024; H01J 2237/1502; H01J 2237/05; H01J 2237/04926; H01J 2237/31713; H01L 21/0415
See application file for complete search history.

(56) References Cited

U.S. PATENT DOCUMENTS

| | | | |
|---|---|---|---|
| 5,629,528 A | 5/1997 | Jost et al. | |
| 7,227,160 B1* | 6/2007 | Vanderberg | H01J 37/1471 250/492.21 |
| 8,637,838 B2* | 1/2014 | Eisner | H01J 37/3171 250/492.21 |
| 9,496,117 B2 | 11/2016 | Schaller et al. | |
| 9,953,801 B1 | 4/2018 | Cristoforo et al. | |
| 2002/0043621 A1* | 4/2002 | Aitken | H01J 37/3171 250/281 |
| 2006/0267001 A1* | 11/2006 | Hung | H01L 51/5012 257/40 |
| 2006/0289798 A1 | 12/2006 | Cummings et al. | |
| 2009/0179161 A1* | 7/2009 | Ward | B82Y 10/00 250/492.21 |
| 2009/0321632 A1* | 12/2009 | Grant | H01J 37/244 250/288 |
| 2012/0298854 A1* | 11/2012 | Hamby | H01J 37/05 250/282 |
| 2014/0261173 A1 | 9/2014 | Lane | |
| 2015/0206701 A1 | 7/2015 | Schaller et al. | |
| 2016/0189917 A1 | 6/2016 | Vanderberg et al. | |

* cited by examiner

ION BEAM QUALITY CONTROL USING A MOVABLE MASS RESOLVING DEVICE

FIELD

Embodiments of the present disclosure relate to systems and methods for controlling ion beam quality, and more particularly, adjusting the position of the resolving aperture and the ion beam's cross-over position in a ribbon-beam tool to improve ion beam quality.

BACKGROUND

The fabrication of a semiconductor device involves a plurality of discrete and complex processes. One such process may be an implant process, where a dopant material is implanted into a workpiece. Another process may be a deposition process, wherein material is deposited on the workpiece. Yet another process may be an eth process where material is removed from the workpiece.

To direct the ions along the desired path, a beam line system with a plurality of components, such as electrodes, mass analyzers, quadrupole lenses, and acceleration/deceleration stages, is used. Much like an optics system, the beam line system manipulates the ions by bending the path of the ions and focusing the ions.

In some embodiments, a ribbon ion beam is created. A ribbon ion beam is an ion beam that is much wider than it is tall. Stated differently, the aspect ratio of the ribbon ion beam, which is defined as its width divided by its height, as measured at the workpiece, may be very high, such as greater than 20. In some embodiments, the width of the ribbon beam is wider than the diameter of the workpiece that is being processed.

When a ribbon ion beam is utilized, there are a number of parameters that are of interest. These parameters include the beam current over the region of interest (ROI), the uniformity of the beam current over the ROI, the horizontal angular distribution of ion beamlets in the ribbon ion beam, and the mean horizontal angle of the ion beamlets in the ribbon ion beam.

In some embodiments, optimizing all of these parameters may be challenging. For example, improving beam current uniformity may degrade the horizontal angular distribution of the ion beamlets in the ribbon ion beam. Thus, the tuning of a ribbon ion beam is often a compromise, as at least one of these parameters is not optimized.

Therefore, it would be beneficial if there was a system and method for tuning a ribbon ion beam that allowed more of these parameters to be optimized. For example, it would be advantageous if there were additional mechanisms that could be employed to achieve improved tuning of the ribbon ion beam.

SUMMARY

A system and method for optimizing a ribbon ion beam in a beam line implantation system is disclosed. The system includes a mass resolving apparatus having a resolving aperture, in which the center of the resolving aperture may be moved in the X and Z directions. Additionally, a controller is able to manipulate the mass analyzer and quadrupole lenses so that the crossover point of desired ions can also be moved in the X and Z directions. By manipulating the crossover point and the center of the resolving aperture, the parameters of the ribbon ion beam may be manipulated to achieve a desired result. Movement of the crossover point in the X direction may affect the mean horizontal angle of the beamlets, while movement of the crossover point in the Z direction may affect the horizontal angular spread and beam current.

According to one embodiment, a beam line ion implantation system is disclosed. The system comprises an ion source; a quadrupole lens; a mass analyzer, wherein ions of a desired species exiting the mass analyzer cross at a crossover point; a collimator disposed after the crossover point; and a mass resolving device, having a resolving aperture, disposed between the mass analyzer and the collimator; wherein the mass resolving device is movable in a Z direction, the Z direction defined as a central trajectory of the ions travelling between the mass analyzer and the collimator. In certain embodiments, the mass resolving device is movable in an X direction, the X direction defined as a direction of a width of the resolving aperture, such that a center of the resolving aperture moves in the X direction. In certain embodiments, the width of the resolving aperture is adjustable, and the width of the resolving aperture is adjusted independent of movement of the center of the resolving aperture. In certain embodiments, the mass resolving device comprises a first portion and a second portion, which are separated by the resolving aperture, and the first portion and the second portion are moved independently to adjust the width of the resolving aperture and the first portion and second portion are moved together to adjust a position of the center of the resolving aperture in the X direction. In certain embodiments, the magnetic fields in the mass analyzer are manipulated to move the crossover point in the X direction. In certain embodiments, the crossover point is aligned with the center of the resolving aperture. In certain embodiments, the quadrupole lens is manipulated to move the crossover point in the Z direction. In certain embodiments, the system comprises a controller in communication with the mass analyzer, the quadrupole lens and the mass resolving device, wherein the controller manipulates magnetic fields in the mass analyzer and manipulates the quadrupole lens to move the crossover point.

According to another embodiment, a method of tuning a ribbon ion beam using an ion implantation system is disclosed. The method comprises using a controller to configure a quadrupole lens and a mass analyzer to set a crossover point at an initial value in an X direction and a Z direction, wherein the crossover point is defined as a point at which ions of a desired species cross after exiting the mass analyzer; moving a mass resolving device so that a center of a resolving aperture is aligned with the crossover point; analyzing characteristics of the ribbon ion beam to create a figure of merit; and if the figure of merit is outside a predetermined limit: selecting a new value of the crossover point in the X direction; configuring the quadrupole lens and the mass analyzer to set the crossover point at the new value; moving the mass resolving device so that the center of the resolving aperture is aligned with the crossover point; and repeating the analyzing at the new value in the X direction. In certain embodiments, the method further comprises checking a horizontal angular spread of the ribbon ion beam if the figure of merit is within the predetermined limit; and if the horizontal angular spread is outside a desired range: selecting a new value of the crossover point in the Z direction; configuring the quadrupole lens and the mass analyzer to set the crossover point at the new value in the Z direction; moving the mass resolving device so that the center of the resolving aperture is aligned with the crossover point; and checking the horizontal angular spread at the new value in the Z direction. In certain embodiments, the figure of merit is based on measured values of beam current, mean horizontal angle and horizontal angular spread. In certain embodiments, the analyzing comprises collecting current in a current collector and measuring a horizontal angle of the ribbon ion beam at a plurality of locations.

In another embodiment, a beam line ion implantation system to create a ribbon ion beam is disclosed. The system comprises an ion source; a mass analyzer, wherein ions of a desired species exit the mass analyzer along a central trajectory; a mass resolving device, disposed downstream from the mass analyzer and having a resolving aperture, wherein a center of the resolving aperture may be moved in at least one direction; and a collimator disposed downstream from the mass resolving device. In certain embodiments, the center of the resolving aperture is moved in a Z direction, the Z direction defined as the central trajectory of the ions traveling between the mass analyzer and the collimator. In certain embodiments, the center of the resolving aperture is moved toward the mass analyzer and the ribbon ion beam becomes convergent. In certain embodiments, the center of the resolving aperture is moved toward the collimator and the ribbon ion beam becomes divergent. In certain embodiments, the center of the resolving aperture is moved in an X direction, the X direction defined as a width direction of the ribbon ion beam perpendicular to the central trajectory. In certain embodiments, the movement of the center of the resolving aperture changes a characteristic of the ribbon ion beam, and wherein the characteristic comprises convergence, divergence, beam current asymmetry, beam current, mean horizontal angle or horizontal angular spread.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
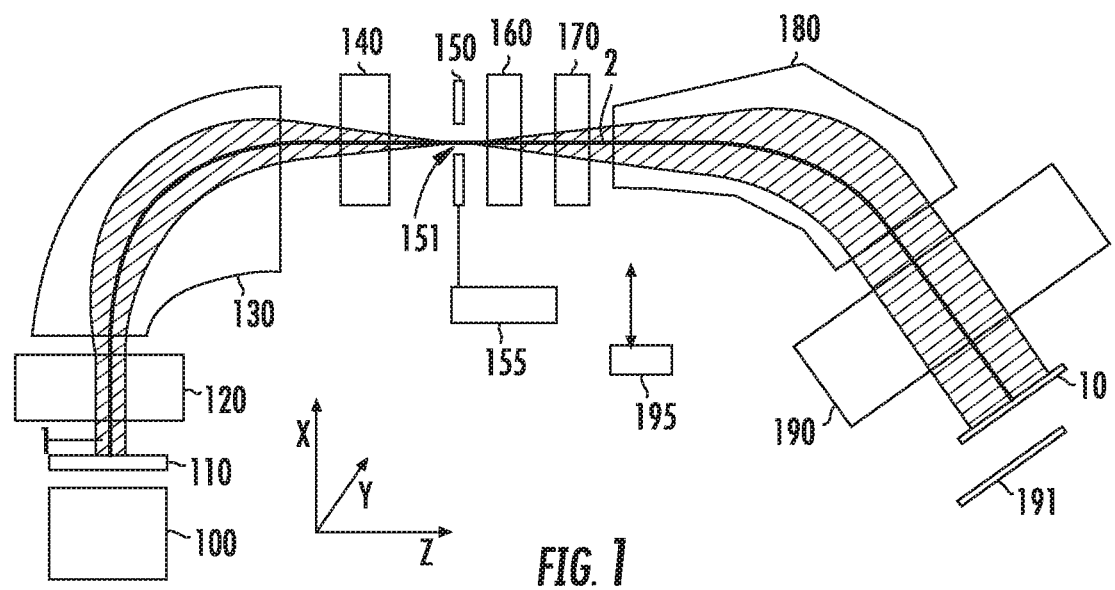
FIG. 1 is a representative view of the system for tuning a ribbon ion beam according to one embodiment.

FIG. 1 shows a beam line ion implantation system that may be used for tuning a ribbon ion beam according to one embodiment. The beam line ion implantation system may be used for processing a workpiece using a ribbon ion beam.

The beam line ion implantation system includes an ion source 100 comprising a plurality of chamber walls defining an ion source chamber. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 10. The extraction aperture may be any suitable shape. In certain embodiments, the extraction aperture may be oval or rectangular shaped, having one dimension, referred to as the width (x-dimension), which may be much larger than the second dimension, referred to as the height (y-dimension). In this way, ions are extracted in the form of a ribbon beam.

Disposed outside and proximate the extraction aperture of the ion source 100 are extraction optics 110. In certain embodiments, the extraction optics 110 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source 100 so as to attract ions through the extraction aperture. The extraction aperture and the aperture in the extraction optics 110 are aligned such that the ions 1 pass through both apertures.

Located downstream from the extraction optics 110 may be a first quadrupole lens 120. The first quadrupole lens 120 cooperates with other quadrupole lenses in the system to focus the ions 1 into an ion beam.

Located downstream from the first quadrupole lens 120 is a mass analyzer 130. The mass analyzer 130 uses magnetic fields to guide the path of the extracted ions 1. The magnetic fields affect the flight path of ions according to their mass and charge. A mass resolving device 150 that has a resolving aperture 151 is disposed at the output, or distal end, of the mass analyzer 130. By proper selection of the magnetic fields, only those ions 1 that have a selected mass and charge will be directed through the resolving aperture 151. Other ions will strike the mass resolving device 150 or a wall of the mass analyzer 130 and will not travel any further in the system. The mass resolving device 150 may be in communication with a mass resolving device mover 155, which is described in more detail below.

A second quadrupole lens 140 may be disposed between the output of the mass analyzer 130 and the mass resolving device 150.

A collimator 180 is disposed downstream from the mass resolving device 150. The collimator 180 accepts the ions 1 that pass through the resolving aperture 151 and creates a ribbon ion beam formed of a plurality of parallel or nearly parallel beamlets. The output, or distal end, of the mass analyzer 130 and the input, or proximal end, of the collimator 180 may be a fixed distance apart. The mass resolving device 150 is disposed in the space between these two components.

A third quadrupole lens 160 may be disposed between the mass resolving device 150 and the input of the collimator 180. A fourth quadrupole lens 170 may also be disposed between the mass resolving device 150 and the input of the collimator 180.

In certain embodiments, the quadrupole lenses may be disposed in other positions. For example, the third quadrupole lens 160 may be disposed between the second quadrupole lens 140 and the mass resolving device 150. Additionally, one or more of the quadrupole lens may be omitted in certain embodiments.

Located downstream from the collimator 180 may be an acceleration/deceleration stage 190. The acceleration/deceleration stage 190 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF).

The ions 1 are extracted as a ribbon beam, having a width, which is represented by the shaded region in the figures. As the ions 1 travel through the system, the path of the ions 1 may be bent, narrowed, broadened or otherwise altered. In the accompanying figures, the path of the ions 1 is shown as a shaded region. The central trajectory 2 of the ions 1 as the ions travel through the beam line ion implantation system is illustrated in FIG. 1. As the ions pass through the mass analyzer 130, the ions on one end of the ribbon beam are manipulated so that these ions cross over to the opposite end of the ribbon beam. FIG. 1 shows that all ions 1 of the desired species, regardless of their original position in the ribbon beam in the mass analyzer 130, cross at one point after the distal end of the mass analyzer 130. This point is referred to throughout this disclosure at the crossover point. In certain embodiments, the center of the resolving aperture 151 is aligned with the crossover point.

A current collector 191 may be used to measure certain parameters associated with the ribbon ion beam, which include beam current, mean horizontal angle and horizontal angular spread. The current collector 191 may comprise one or more Faraday devices. The Faraday devices collect current and are able to measure an amount of current collected by the device. The Faraday devices are also able to determine the angle of incidence of the ions that strike the device so that a mean horizontal angle may be determined at a plurality of locations. While the current collector 191 is illustrated as being near the workpiece 10, it is understood that it may be located in other locations along the beam line. For example, in one embodiment, the current collector 191 may be disposed in the position typically occupied by the workpiece 10 during operation. In this way, the current collector 191 provides feedback that is representative of the current that is experienced by the workpiece 10.

A controller 195 is also used to control the system. The controller 195 has a processing unit and an associated memory device. This memory device contains the instructions, which, when executed by the processing unit, enable the system to perform the functions described herein. This memory device may be any non-transitory storage medium, including a non-volatile memory, such as a FLASH ROM, an electrically erasable ROM or other suitable devices. In other embodiments, the memory device may be a volatile memory, such as a RAM or DRAM. In certain embodiments, the controller 195 may be a general purpose computer, an embedded processor, or a specially designed microcontroller. The actual implementation of the controller 195 is not limited by this disclosure.

The controller 195 may be in communication with each of the quadrupole lenses, the mass analyzer 130, and the mass resolving device mover 155. In addition, the controller 195 may be in communication with a current collector 191 so that it may optimize or improve operation of these components based on actual measured parameters.

In the present disclosure, the mass resolving device 150 is capable of being moved in the X and Z directions by the mass resolving device mover 155. For example, the mass resolving device 150 may be moved so as to be closer to the output of the mass analyzer 130 or closer to the input of the collimator 180. The Z direction is defined as the direction of the central trajectory 2 of the ion beam as the ion beam moves through the system. For example, at the resolving aperture 151, the Z direction is left-to-right, as shown in the coordinate axis in the legend and indicated by central trajectory 2. However, the Z direction changes as the ion beam moves through the beam line ion implantation system, as the central trajectory 2 changes direction as it moves through the various components. Thus, the Z direction is always tangential to the central trajectory 2. The X direction is defined as the direction of the width of the resolving aperture 151 and the width of the ion beam. The Y direction is defined as a height direction of the ion beam. Thus, the X direction is parallel to the long dimension of the ribbon ion beam, while the Y axis is parallel to the short dimension of the ribbon ion beam. The X direction is defined as perpendicular to the central trajectory 2 of the ions (i.e. the Z direction) and the Y direction. In all of the figures that illustrate a coordinate system, that coordinate system shows the coordinates at the resolving aperture 151.

Typically, the resolving aperture 151 of the mass resolving device 150 may be positioned along the centerline of the output of the mass analyzer 130 and the input to the collimator 180. For example, the resolving aperture 151 may be positioned at the optical focal point of the collimator 180. Additionally, the magnetic fields of the mass analyzer 130 are configured such that the crossover point of the desired ions is at the center of the resolving aperture 151, as shown in FIG. 1.

The collimator 180 is responsible for creating an ion beam having roughly constant beam current across the region of interest (ROI), and creating substantially parallel beamlets that make up the ribbon ion beam.

Unexpectedly, it has been discovered that by moving the crossover point of the desired ions relative to the input to the collimator 180 or another component downstream from the mass resolving device 150, the beam current, horizontal angular distribution and mean horizontal angle can be manipulated.

In certain embodiments, the crossover point of the desired ions can be moved in the X direction by varying the magnetic fields applied in the mass analyzer 130. This may be performed by the controller 195. The crossover point of the desired ions can be moved in the Z direction by varying the parameters of the quadrupole lenses, such as first quadrupole lens 120 and second quadrupole lens 140. Further, if third quadrupole lens 160 is located before the mass resolving device 150, parameters of third quadrupole lens 160 may also be varied to move the crossover point. Again, this may be performed by the controller 195.

Figure 2A:
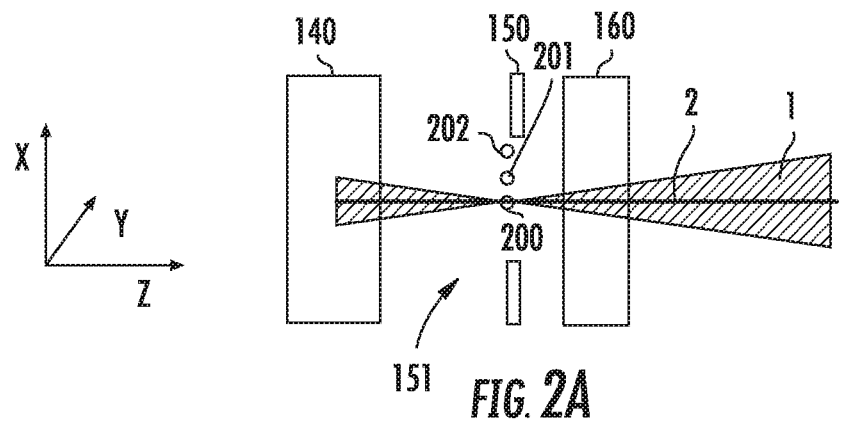
FIG. 2A shows a portion of the system of FIG. 1 with 3 crossover points in the X direction.

FIG. 2A shows the central trajectory 2 of the ions 1, the second quadrupole lens 140, the mass resolving device 150 and the third quadrupole lens 160 in the same configuration as shown in FIG. 1. Point 200 represents the crossover point of the desired ions in the traditional configuration, where the crossover point is aligned with the centerline of the output of the mass analyzer 130 and the optical focal point of the collimator 180. Point 201 shows a second potential crossover point, which is moved about 5-10 mm in the positive X direction relative to point 200. As noted above, this second potential crossover point (i.e. point 201) may be created by adjusting the magnetic fields in the mass analyzer 130. Point 202 shows a third potential crossover point, which is moved about 10-20 mm in the positive X direction relative to point 200. As noted above, this third potential crossover point (i.e. point 202) may be created by adjusting the magnetic fields in the mass analyzer 130. Although not shown, it is understood that it is possible to move the crossover point in the negative X direction as well. Further, while not shown, it is understood that the center of the resolving aperture 151 is also moved to correspond to the crossover points.

Figure 2B:
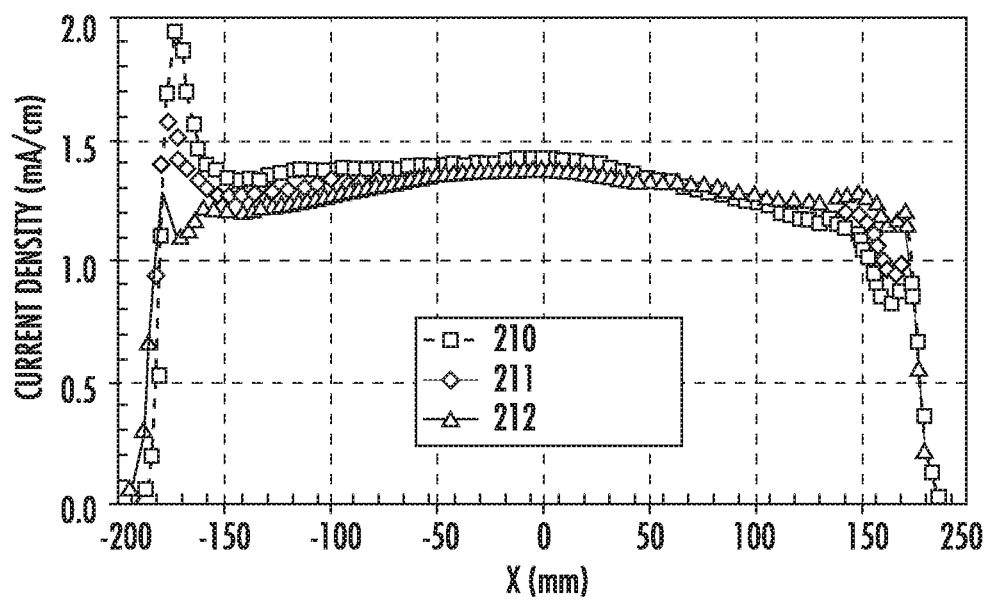
FIG. 2B-2E are graphs showing the effect of moving the crossover point on various parameters.
Figure 2C:
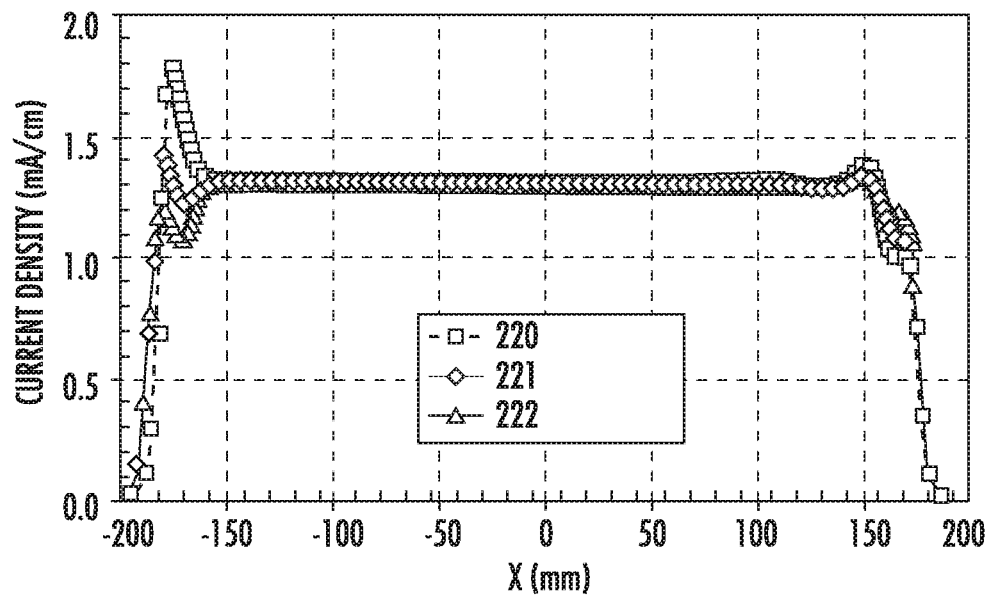

FIG. 2B shows three lines which represent the beam current density of the ribbon ion beam as a function of position in the X direction that is produced using each of the 3 potential crossover points. Line 210 corresponds to point 200; line 211 corresponds to point 201; and line 212 corresponds to point 202. The X axis represents the position of the ribbon ion beam in the X direction, measured in millimeters at the location of the workpiece 10. The Y axis represents the current density, measured in mA/cm. These measurements may be performed using current collector 191. In certain embodiments, the beam current measurement is made at the location of the workpiece 10 by moving a Faraday device. These measurements were made before the ribbon ion beam was tuned for uniformity. Note that the beam current profile is affected by movement of the crossover point in the X direction. Specifically, the beam current at one end of the beam is reduced as the crossover point is moved in the X direction, while the beam current at the opposite end of the ribbon ion beam is increased. FIG. 2C shows three lines which represent the beam current density of the uniformity tuned ribbon ion beam as a function of position in the X direction that is produced using each of the 3 potential crossover points. Line 220 corresponds to point 200; line 221 corresponds to point 201; and line 222 corresponds to point 202. As can be seen in FIG. 2C, the movement of the crossover point in the X direction has a small effect on the current density over the entire region of interest. In fact, the current in the region of interest for point 200 is 41.7 mA, while the current in the ROI for point 202 almost the same.

Figure 2D:
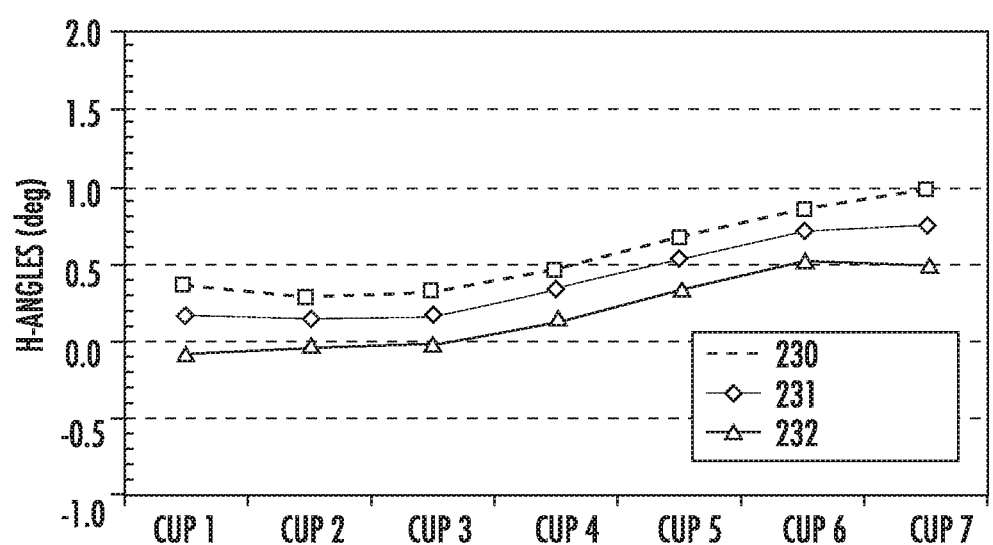
Figure 2E:
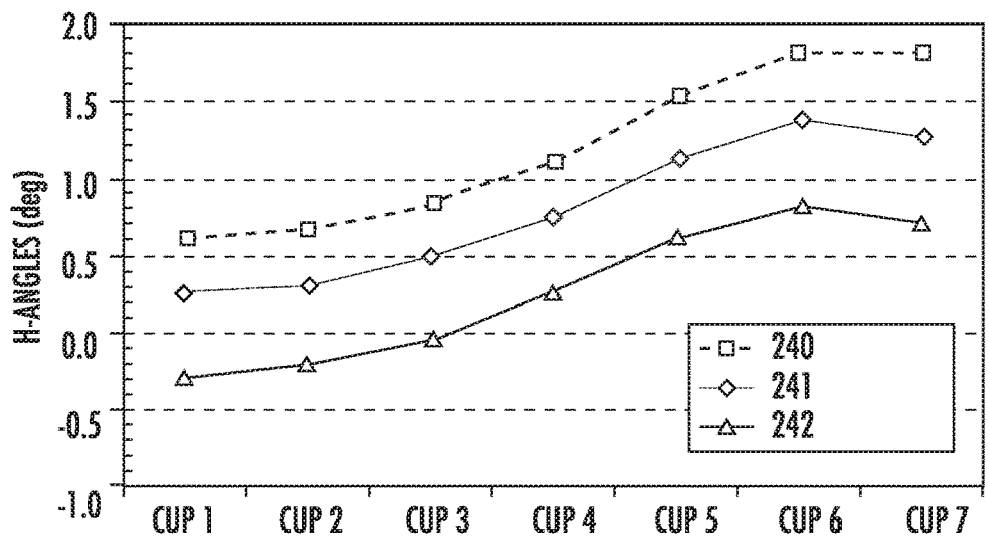

FIG. 2D shows the average horizontal beam angle at seven points along the ribbon ion beam measured at the position of the workpiece 10. Specifically, the current collector 191 measures the mean horizontal angle of the parallel beamlets in each of seven locations along the X direction of the ribbon ion beam. This graph shows three lines which represent the average horizontal beam angle of the ribbon ion beam as a function of position in the X direction that is produced using each of the 3 potential crossover points. Line 230 corresponds to point 200; line 231 corresponds to point 201; and line 232 corresponds to point 202. The X axis represents each of 7 positions in the ribbon ion beam in the X direction. The Y axis represents the mean horizontal angle, measured in degrees. This data was measured before the ribbon ion beam was tuned for uniformity. FIG. 2E represents the same information for the tuned ribbon ion beam. Line 240 corresponds to point 200; line 241 corresponds to point 201; and line 242 corresponds to point 202.

FIG. 2E shows that the mean horizontal beam angle is heavily influenced by the movement of the crossover point in the X direction. Line 240 shows a mean horizontal angle of 1.19° with a horizontal angular spread of 0.62°. Horizontal angular spread is defined as the maximum horizontal angle of the 7 positions, less the mean horizontal angle of the 7 positions. This value is approximately the 3 sigma value of the seven collected values. In contrast, line 242 shows a mean horizontal angle of 0.27° with a horizontal angular spread of 0.56°.

Thus, in summary, movement of the crossover point and the center of the resolving aperture 151 in the X direction has little effect on the beam current and the horizontal angular spread. However, movement of the crossover point and the center of the resolving aperture 151 in the X direction does affect the mean horizontal angle. Movement of the crossover point and the center of the resolving aperture 151 in the X direction also affects the current profile of the ribbon ion beam.

Figure 3A:
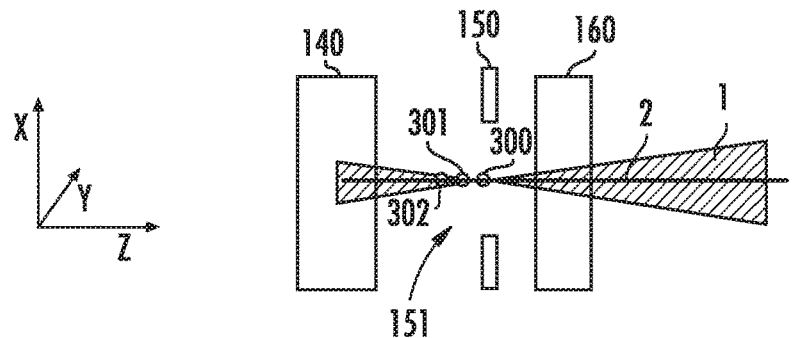
FIG. 3A shows a portion of the system of FIG. 1 with 3 crossover points in the Z direction.

FIG. 3A shows the central trajectory 2 of the ions 1, the second quadrupole lens 140, the mass resolving device 150 and the third quadrupole lens 160 in the same configuration as shown in FIG. 1. Point 300 represents the crossover point of the desired ions in the traditional configuration, where the crossover point is aligned with the centerline of the output of the mass analyzer 130 and the optical focal point of the collimator 180. Point 301 shows a second potential crossover point, which is moved approximately 10 mm in the negative Z direction relative to point 300. As noted above, this second potential crossover point (i.e. point 301) may be created by adjusting the parameters of at least one of the first quadrupole lens 120 and the second quadrupole lens 140. As described earlier, in certain embodiments, the parameters of third quadrupole lens 160 may be adjusted. Point 301 is closer to the output of the mass analyzer 130 than point 300. Point 302 shows a third potential crossover point, which is moved approximately 20 mm in the negative Z direction relative to point 300. As noted above, this third potential crossover point (i.e. point 302) may be created by adjusting the parameters of at least one of the quadrupole lenses. Point 302 is closer to the output of the mass analyzer 130 than point 301. While not shown, the crossover point may also be moved in the positive Z direction. Further, while not shown, it is understood that the center of the resolving aperture 151 is also moved to correspond to the crossover points.

Figure 3B:
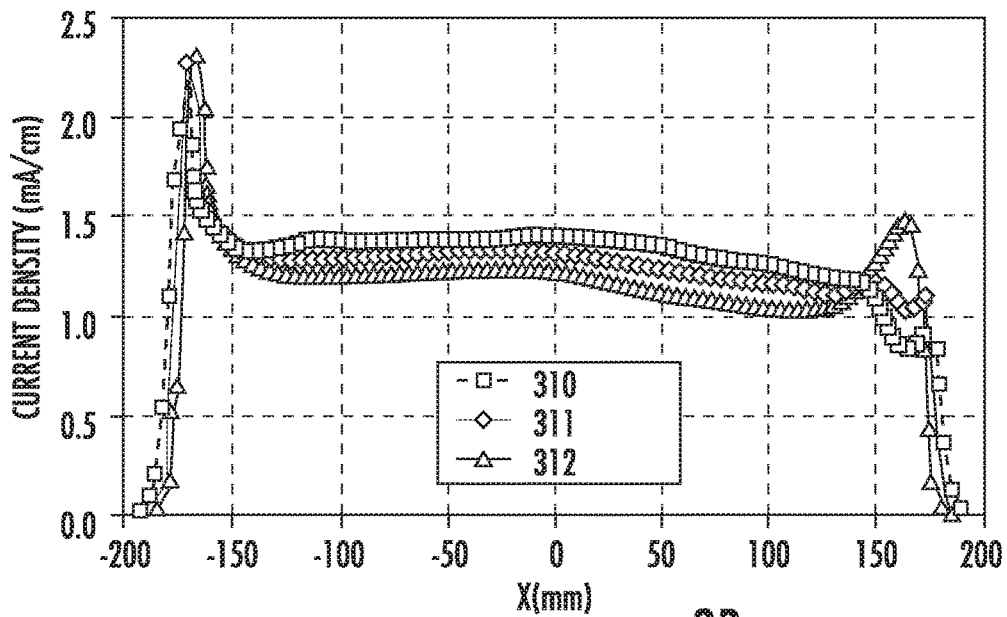
FIG. 3B-3E are graphs showing the effect of moving the crossover point on various parameters.

FIG. 3B shows three lines which represent the beam current density of the ribbon ion beam, measured at the location of the workpiece 10, as a function of position in the X direction that is produced using each of the 3 potential crossover points. Line 310 corresponds to point 300; line 311 corresponds to point 301; and line 312 corresponds to point 302. As was described above, the X axis represents the position of the ribbon ion beam in the X direction, measured in millimeters, at the location of the workpiece 10. The Y axis represents the current density, measured in mA/cm.

Figure 3C:
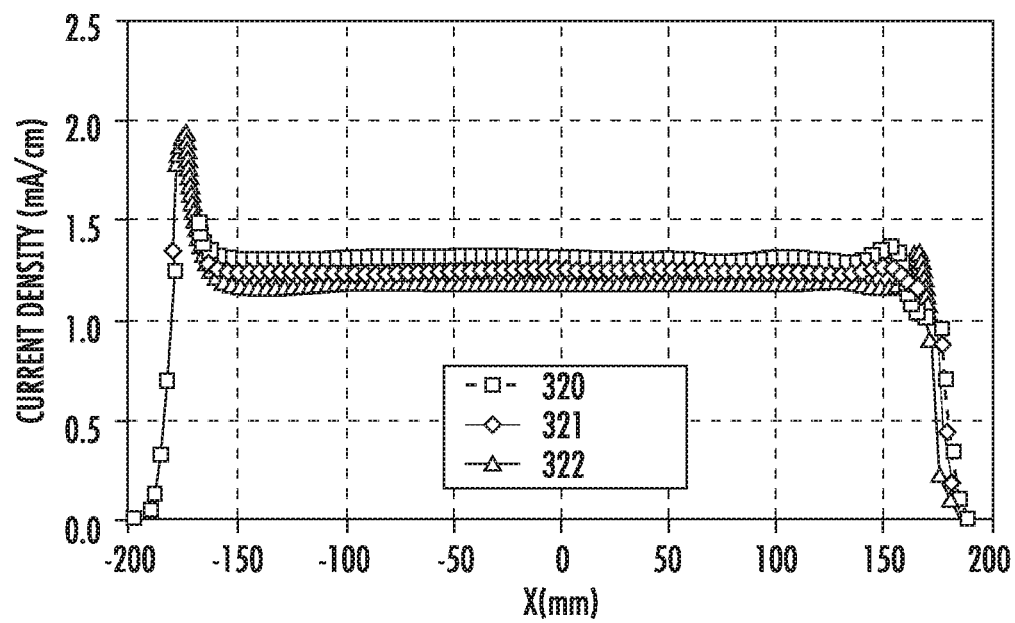

These measurements were made before the ribbon ion beam was tuned for uniformity. FIG. 3C shows three lines which represent the beam current density of the uniformity tuned ribbon ion beam as a function of position in the X direction that is produced using each of the 3 potential crossover points. Line 320 corresponds to point 300; line 321 corresponds to point 301; and line 322 corresponds to point 302. As can be seen in FIG. 3C, the movement of the crossover point and the center of the resolving aperture 151 in the negative Z direction has a negative effect on the current density over the entire region of interest. In fact, the current in the region of interest for point 300 is 41.7 mA, while the current in the ROI for point 302 was about 10% less.

Figure 3D:
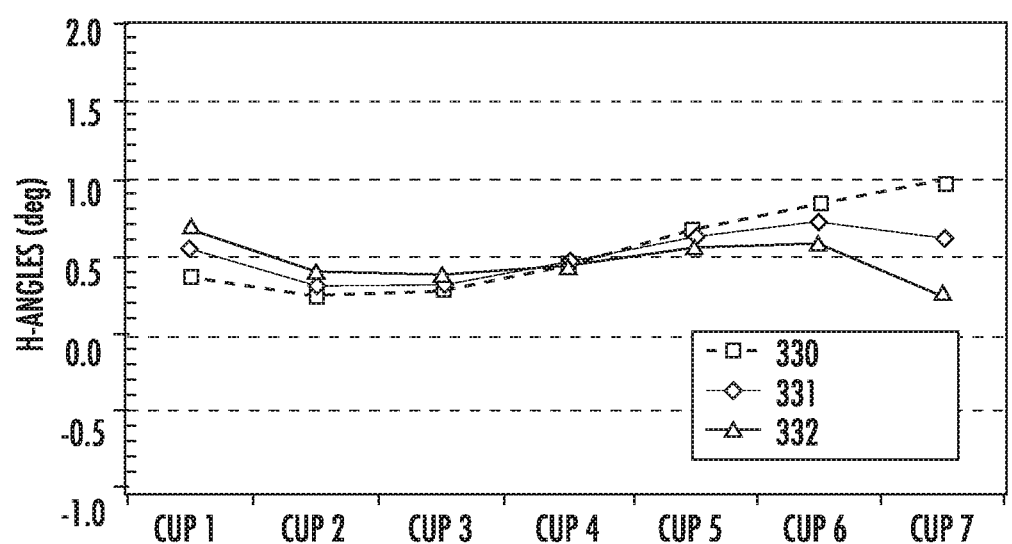
Figure 3E:
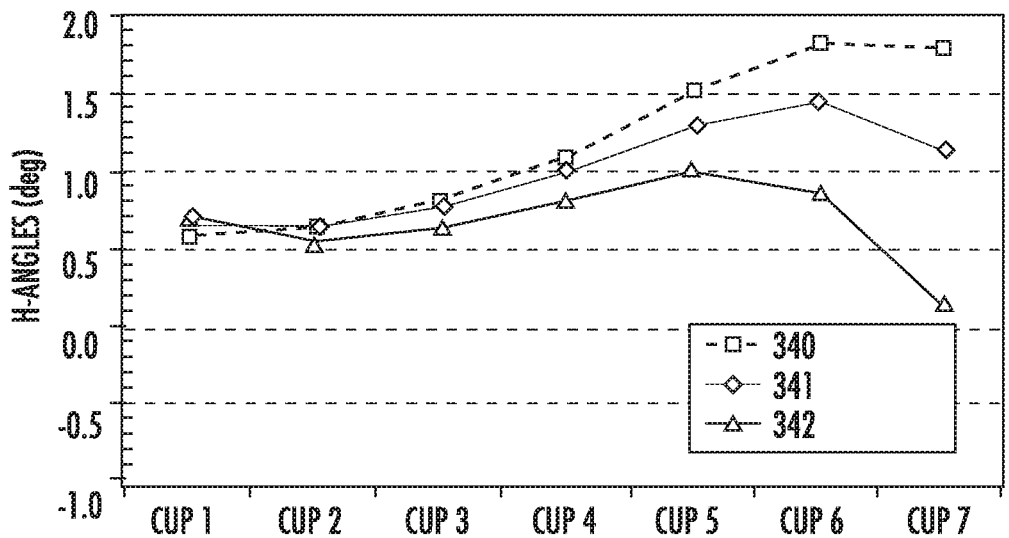

FIG. 3D shows the average horizontal beam angle at seven points along the ribbon ion beam. This graph shows three lines which represent the average horizontal beam angle of the ribbon ion beam as a function of position in the X direction that is produced using each of the 3 potential crossover points. Line 330 corresponds to point 300; line 331 corresponds to point 301; and line 332 corresponds to point 302. The X axis represents each of 7 positions in the ribbon ion beam in the X direction. The Y axis represents the mean horizontal angle, measured in degrees. This data was measured before the ribbon ion beam was tuned for uniformity. FIG. 3E represents the same information for the uniformity tuned ribbon ion beam. Line 340 corresponds to point 300; line 341 corresponds to point 301; and line 342 corresponds to point 302.

FIG. 3E shows that the mean horizontal angle and the horizontal angular spread are both influenced by the movement of the crossover point and the center of the resolving aperture 151 in the Z direction. Line 340 shows a mean horizontal angle of 1.19° with a horizontal angular spread of 0.62°. In contrast, line 342 shows a mean horizontal angle of 0.71° with a horizontal angular spread of 0.51°.

Thus, in summary, movement of the crossover point and the center of the resolving aperture 151 in the Z direction has a somewhat negative effect on the beam current and a positive effect on the mean horizontal angle and the horizontal angular spread.

While the previous figures show the effects of movement of the crossover point and the center of the resolving aperture 151 in one direction, it is understood that the crossover point and the center of the resolving aperture 151 may be moved in two directions.

Figure 4A:
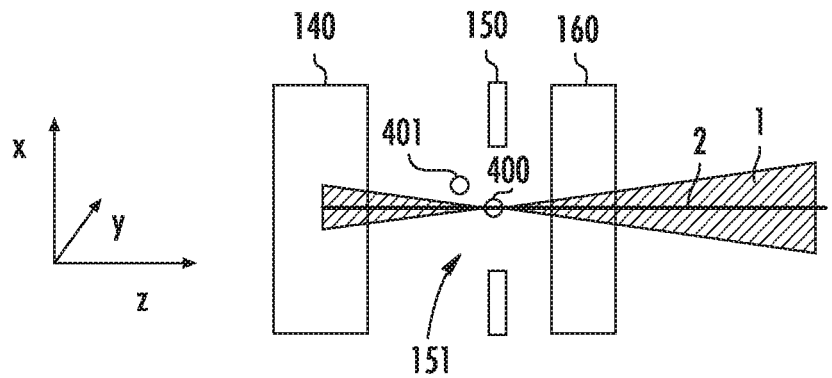
FIG. 4A shows a portion of the system of FIG. 1 with 2 crossover points.

FIG. 4A shows the central trajectory 2 of the ions, the second quadrupole lens 140, the mass resolving device 150 and the third quadrupole lens 160 in the same configuration as shown in FIG. 1. Point 400 represents the crossover point of the desired ions in the traditional configuration, where the crossover point is aligned with the centerline of the output of the mass analyzer 130 and the optical focal point of the collimator 180. Point 401 shows a second potential crossover point, which is moved in the about 6 mm in the positive X direction and about 12 mm in the negative Z direction relative to point 400. As noted above, this second potential crossover point (i.e. point 401) may be created by adjusting the magnetic fields in the mass analyzer 130 and by adjusting the parameters of at least one of the first quadrupole lens 120 and the second quadrupole lens 140. Point 401 is closer to the output of the mass analyzer 130 than point 400. Further, while not shown, it is understood that the center of the resolving aperture 151 is also moved to correspond to the crossover points.

Figure 4B:
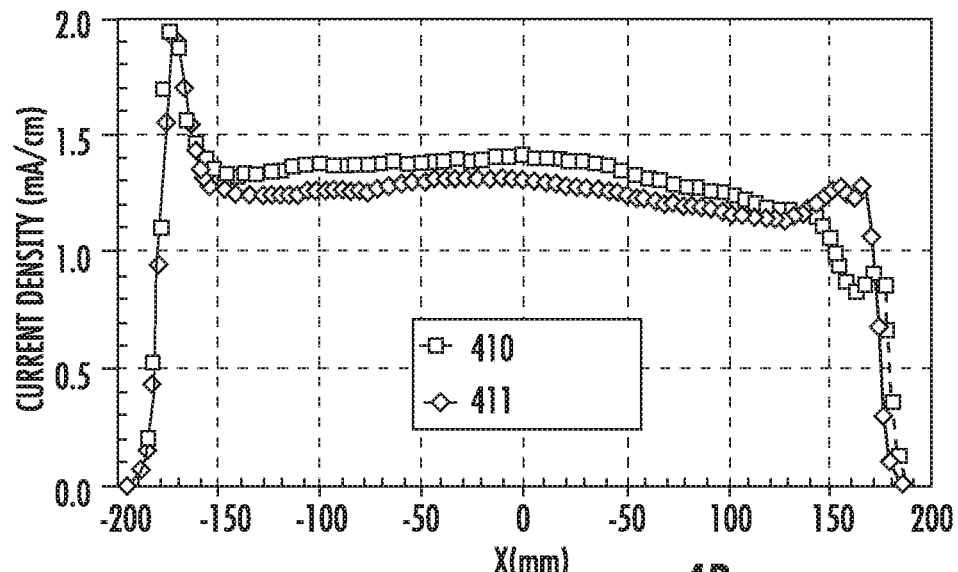
FIG. 4B-4E are graphs showing the effect of moving the crossover point on various parameters.
Figure 4C:
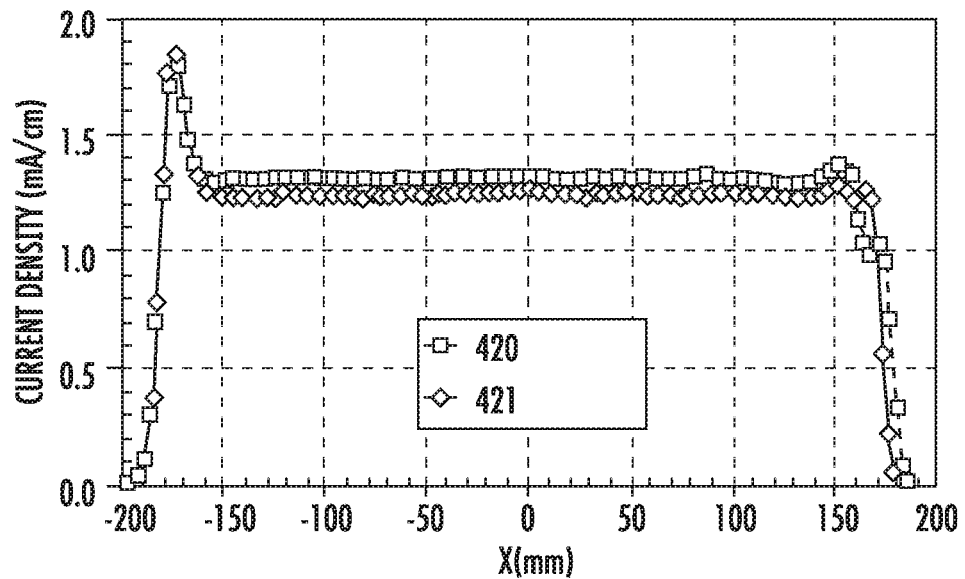

FIG. 4B shows two lines which represent the beam current density of the ribbon ion beam as a function of position in the X direction that is produced using each of the 2 potential crossover points. Line 410 corresponds to point 400; and line 411 corresponds to point 401. As was described above, the X axis represents the position of the ribbon ion beam in the X direction, measured in millimeters, at the location of the workpiece 10. The Y axis represents the current density, measured in mA/cm. These measurements were made before the ribbon ion beam was tuned. Interestingly, by moving the crossover point from point 400 to point 401, the beam current is slightly less, yet the beam current profile is more uniform, which may be beneficial for uniformity tuning. FIG. 4C shows two lines which represent the beam current density of the tuned ribbon ion beam as a function of position in the X direction that is produced using each of the 2 potential crossover points. Line 420 corresponds to point 400; and line 421 corresponds to point 401. As can be seen in FIG. 4C, the movement of the crossover point in the X and Z direction has a slightly negative effect on the current density over the entire region of interest. In fact, the current in the region of interest for point 400 is 41.7 mA, while the current in the ROI for point 401 was about 5% less.

Figure 4D:
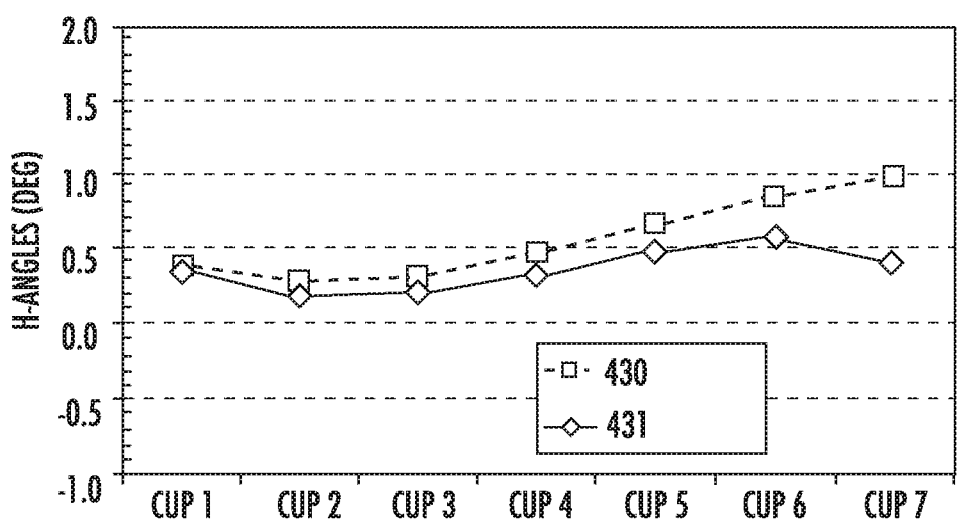
Figure 4E:
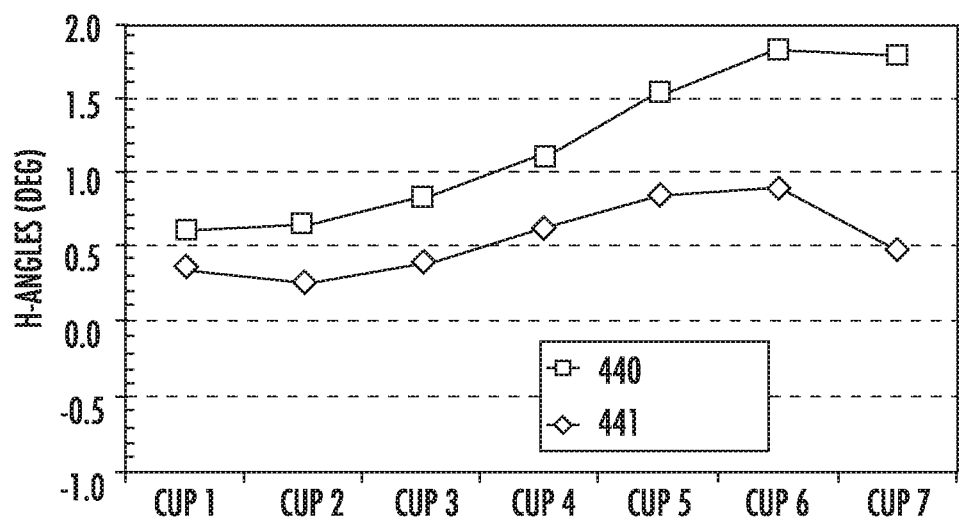

FIG. 4D shows the average horizontal beam angle at seven points along the ribbon ion beam. This graph shows two lines which represent the average horizontal beam angle of the ribbon ion beam as a function of position in the X direction that is produced using each of the 2 potential crossover points. Line 430 corresponds to point 400; and line 431 corresponds to point 401. The X axis represents each of 7 positions in the ribbon ion beam in the X direction. The Y axis represents the mean horizontal angle, measured in degrees. This data was measured before the ribbon ion beam was tuned for uniformity. FIG. 4E represents the same information for the tuned ribbon ion beam. Line 440 corresponds to point 400; and line 441 corresponds to point 401.

FIG. 4E shows that the mean horizontal angle and the horizontal angular spread are both positively influenced by the movement of the crossover point and the center of the resolving aperture 151 in the X and Z directions. Line 440 shows a mean horizontal angle of 1.19° with a horizontal angular spread of 0.62°. In contrast, line 441 shows a mean horizontal angle of 0.54° with a horizontal angular spread of 0.34°. Thus, in one test, a 55% reduction in mean horizontal angle and a 45% reduction in horizontal angular spread can be achieved by moving the crossover point and the center of the resolving aperture 151 in the X and Z directions.

Thus, parameters of a ribbon ion beam, such as beam current, mean horizontal angle and horizontal angular spread can be manipulated and optimized by translating the crossover point of the desired species exiting the mass analyzer 130 in the X and Z directions. The center of the resolving aperture 151 is also moved to align with the crossover point.

The results shown in the previous figures were attained during one particular set of tests. Results may vary depending on the selection of various operating parameters, such as beam energy, ion species and extraction beam current. Thus, these results were presented to illustrate the trends associated with the movement of the crossover point.

Figure 5:
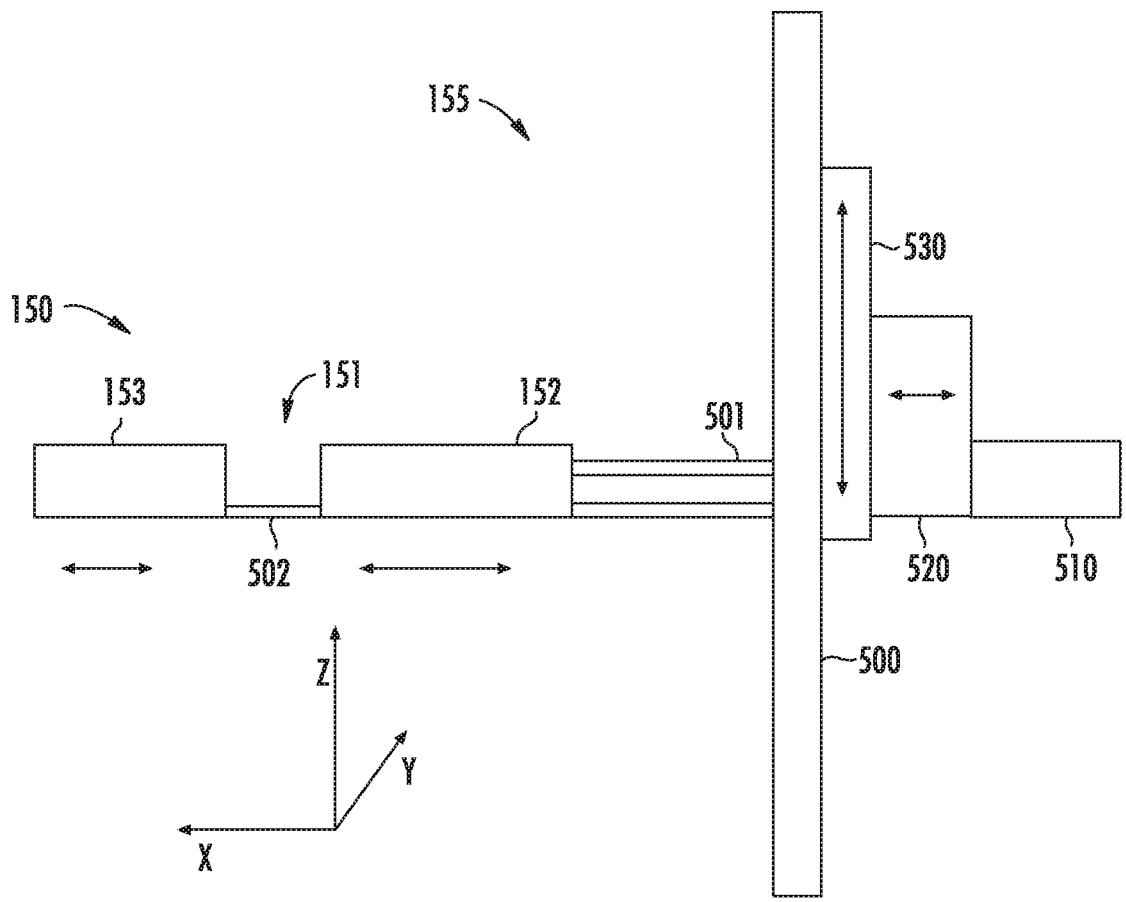
FIG. 5 shows the mass resolving device mover according to one embodiment.

FIG. 5 shows a schematic of the mass resolving device mover 155 according to one embodiment.

The mass resolving device mover 155 may be disposed outside of the main housing of the beam line ion implantation system. For example, a wall 500 may separate the beam line ion implantation system from an outside environment. The mass resolving device 150 is disposed inside the main housing. The mass resolving device 150 may comprise a first portion 152 and a second portion 153, which are separated by the resolving aperture 151. In some embodiments, the first portion 152 is supported by a first rod 501 and the second portion 153 is supported by a second rod 502. The first rod 501 and the second rod 502 may pass through the wall 500 and be in communication with a spacing motor 510. The spacing motor 510 is able to independently move the first rod 501 and the second rod 502 in opposite directions. In this way, the spacing motor 510 is able to adjust the width of the resolving aperture 151 in the X direction. Located proximate the spacing motor 510 is the X adjustment motor 520. The X adjustment motor 520 is capable of moving the spacing motor 510 in the X direction. This serves to move the first portion 152 and second portion 153 together. In other words, the spacing motor 510 sets the width of the resolving aperture 151 and the X adjustment motor 520 moves the center of the resolving aperture 151 in the X direction. In another embodiment, the spacing motor 510 and the X adjustment motor 520 may be combined such that a single motor both controls the width of the resolving aperture 151 and the X position of the center of the resolving aperture 151. A Z adjustment motor 530 is capable of moving the spacing motor 510 and the X adjustment motor 520 in the Z direction. The controller 195 may be in communication with the spacing motor 510, the X adjustment motor 520 and the Z adjustment motor 530 so as to control the width of the resolving aperture 151 and the position of the center of the resolving aperture 151.

As described above, the present disclosure describes a mass resolving device 150 that can be moved in the X direction. It is understood that varying the width of the resolving aperture 151 involves movement in the X direction. However, the present disclosure describes movement in the X direction where the center of the resolving aperture 151 is moved in the X direction.

Thus, in one embodiment, the disclosure describes a beam line ion implantation system where the mass resolving device 150 has a resolving aperture 151, that center of which can be moved in both the X and Z directions. The beam line ion implantation system also includes a controller 195 that is able to control the mass analyzer 130 and the quadrupole lens so that the crossover point of the desired ions can be moved in both the X and Z directions. In some embodiments, the controller 195 is able to control the mass analyzer 130 and other components so that the central trajectory 2 of the ions is shifted in at least one direction, such as the X direction. Movement of the resolving aperture 151, the central trajectory 2 of the ions and the crossover point may allow some parameters of the ribbon ion beam to be optimized or improved.

In another embodiment, the beam line ion implantation system includes a mass resolving device 150 that has a resolving aperture 151, the center of which can be moved in one direction; either the X direction or the Z direction. The beam line ion implantation system also includes a controller 195 that is able to control the mass analyzer 130 and the quadrupole lens so that the crossover point of the desired ions can be moved in either the X direction or the Z direction. In this embodiment, one of the X adjustment motor 520 or the Z adjustment motor 530 may not be included in the beam line ion implantation system.

Of course, other configurations are also possible. For example, more sophisticated schemes such as using piezo or vacuum liner motors, may be used to achieve the same result.

In another configuration, a spot beam may be extracted from the ion source 100. The spot beam may travel through the mass analyzer 130 and the mass resolving device 150. In this embodiments, quadrupole lenses may or may not be employed. The spot beam may then enter a scanner which is disposed between the collimator 180 and the mass resolving device 150. The scanner causes the spot beam to be fanned out into a plurality of divergent beamlets. The scanner may be electrostatic or magnetic. The collimator 180 then converts these divergent beamlets into a plurality of parallel beamlets that form the ribbon ion beam. In this embodiment, the controller 195 may control the mass analyzer 130 to move the central trajectory 2 of the ions in the X or Y direction. The mass resolving device 150 is also moved so that the center of the resolving aperture 151 is aligned with the central trajectory 2. This central trajectory 2 may not be aligned with the centerline of the scanner. This movement of the central trajectory 2 and the center of the resolving aperture 151 may affect various parameters of the ribbon ion beam that is created, including the convergence, the divergence, the current profile, the mean horizontal angle, and the horizontal angular spread.

Figure 6:
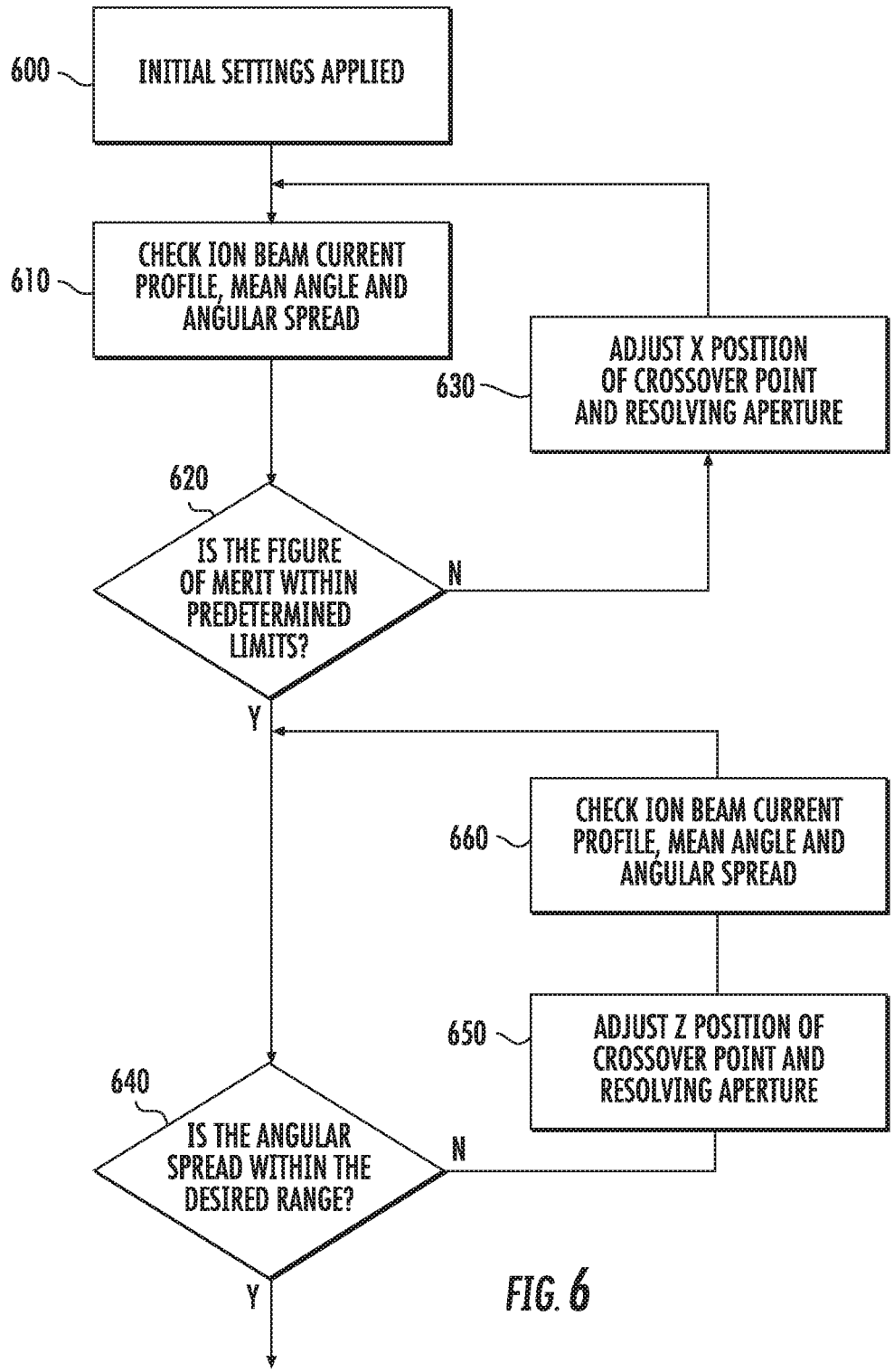
FIG. 6 is a flowchart showing a method of tuning a ribbon ion beam using the system of FIG. 1.

FIG. 6 illustrates a flowchart that shows one embodiment in which the controller 195 may optimize or improve parameters of the ribbon ion beam. This sequence may be performed by the controller 195.

First, as shown in Box 600, an initial setting is applied to the beam line ion implantation system shown in FIG. 1. This may include initial values for the quadrupole lenses, the mass analyzer 130, and other components. Using the current collector 191, the controller 195 can analyze various parameters of the ribbon ion beam, such as beam current across the region of interest, beam mean horizontal angle and horizontal angular spread, as shown in Box 610. The controller 195 may determine a figure of merit based on these measured parameters. In one embodiment, the figure of merit may be defined as $w1 \times I + w2 \times (\text{mean horizontal angle}) + w3 \times (\text{horizontal angular spread})$, wherein $w1$, $w2$ and $w3$ are weighting coefficients and I is the measured beam current or simply "beam current". The controller 195 then compares the figure of merit to a predetermined limit, as shown in Box 620. If the figure of merit is not acceptable, the controller 195 adjusts the X position of the crossover point and resolving aperture 151, as shown in Box 630. The controller 195 then uses the current collector 191 to collect information so that the various parameters of the ribbon ion beam can be analyzed, as shown in Box 610. The controller 195 then checks the figure of merit again using the adjusted X position of the crossover point and resolving aperture 151, as shown in Box 620.

Once the figure of merit is within the predetermined limits, the controller 195 determines whether the horizontal angular spread is within predetermined limits, as shown in Box 640. If the horizontal angular spread is not within predetermined limits, the controller 195 adjusts the Z position of the crossover point and resolving aperture 151, as shown in Box 650. The controller 195 then uses the current collector 191 to collect information so that the various parameters of the ribbon ion beam can be analyzed, as shown in Box 660. The controller 195 then checks the horizontal angular spread again using the new Z position of the crossover point and resolving aperture 151, as shown in Box 640. Once the horizontal angular spread is within the predetermined limits, the tuning process is complete. The sequence shown in FIG. 6 uses the fact that the mean horizontal angle and beam current are not substantially affected when the Z position of the crossover point and resolving aperture 151 are moved.

In another embodiment, the controller 195 may perform a more exhaustive analysis to optimize the parameters of the ribbon ion beam. For example, the controller 195 may set an initial X position for the crossover point and the resolving aperture 151. It may then take measurements at a variety of Z positions using the current collector 191, while maintaining this X position. The controller 195 may then move the resolving aperture 151 and the crossover point to a second X position, and take measurements at a variety of Z positions, while maintaining this second X position. This may be repeated a plurality of times. Once all X positions have been analyzed, the controller 195 may have data that allows the optimal configuration of the crossover point to be determined. In other words, the controller 195 will create a two dimensional matrix where X position and Z position of the crossover point are the two dimensions. The values at each point in the matrix represent the parameters of the ribbon ion beam associated with that combination of X and Z positions. In other embodiments, the value at each point in the matric may represent a figure of merit derived from the parameters of the ribbon ion beam.

The system and method described herein have many advantages. As described above, often times there is a conflict between optimizing beam current uniformity across the region or interest and the mean horizontal angle and horizontal angular spread. High beam current uniformity may lead to higher than desired horizontal angular spread. By manipulating the crossover point of the desired ions and moving the mass resolving device 150 accordingly, another tuning mechanism can be incorporated into the system. Thus, as shown in FIG. 4E, mean horizontal angle and horizontal angular spread are improved while having minimal negative effect on beam current.

Figure 7:
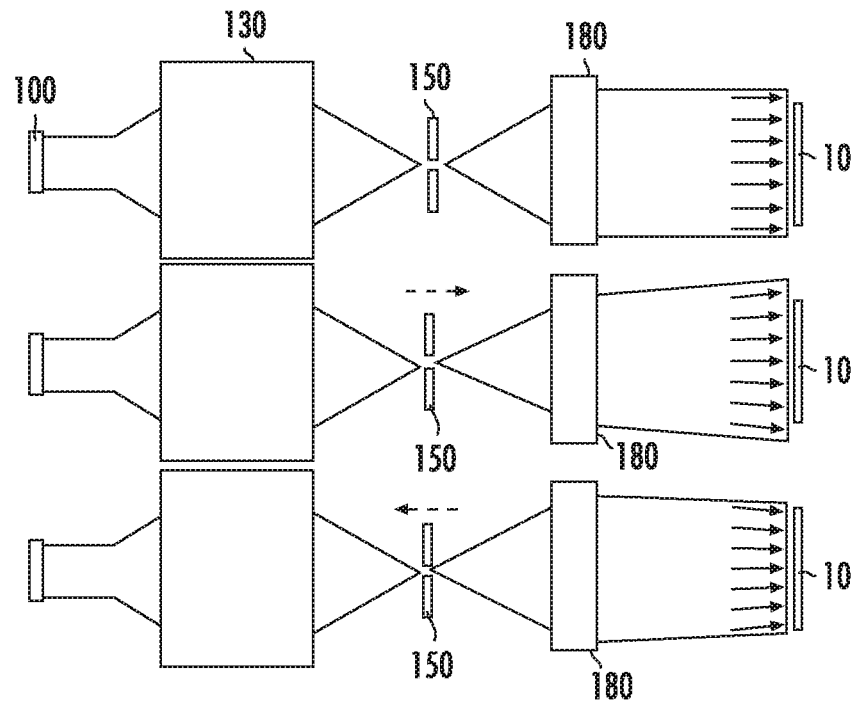
FIG. 7 shows another application for the system of FIG. 1.

While the above disclosure describes a system where the ribbon ion beam is optimized to reduce the mean horizontal angle and the horizontal angular spread, other embodiments are also possible. For example, movement of the crossover point and the resolving aperture 151 in the Z directions may have other uses. FIG. 7 shows a high level representation of the system of FIG. 1, where the mass analyzer 130, the mass resolving device 150 and the collimator 180 are shown. In traditional systems, as shown on the top illustration, the resulting ion beam is made up of parallel or substantially parallel beamlets. If the mass resolving device 150 is moved in the positive Z direction toward the collimator 180, as shown in the middle illustration, a divergent ion beam may be created. Conversely, if the mass resolving device is moved in the negative Z direction toward the mass analyzer 130, as shown in the bottom illustration, a convergent ion beam may be created.

The ability to create convergent and divergent ion beams may be useful for directional ion beam processing, such as directional etch and/or deposition processes, that often utilizes a divergent and convergent beam for different device structures and applications.

This embodiment has other advantages as well. The ability to position the mass resolving device 150 at different locations in the Z direction may be used for processing different size of substrates, which may utilize slightly different beam widths.

Figure 8:
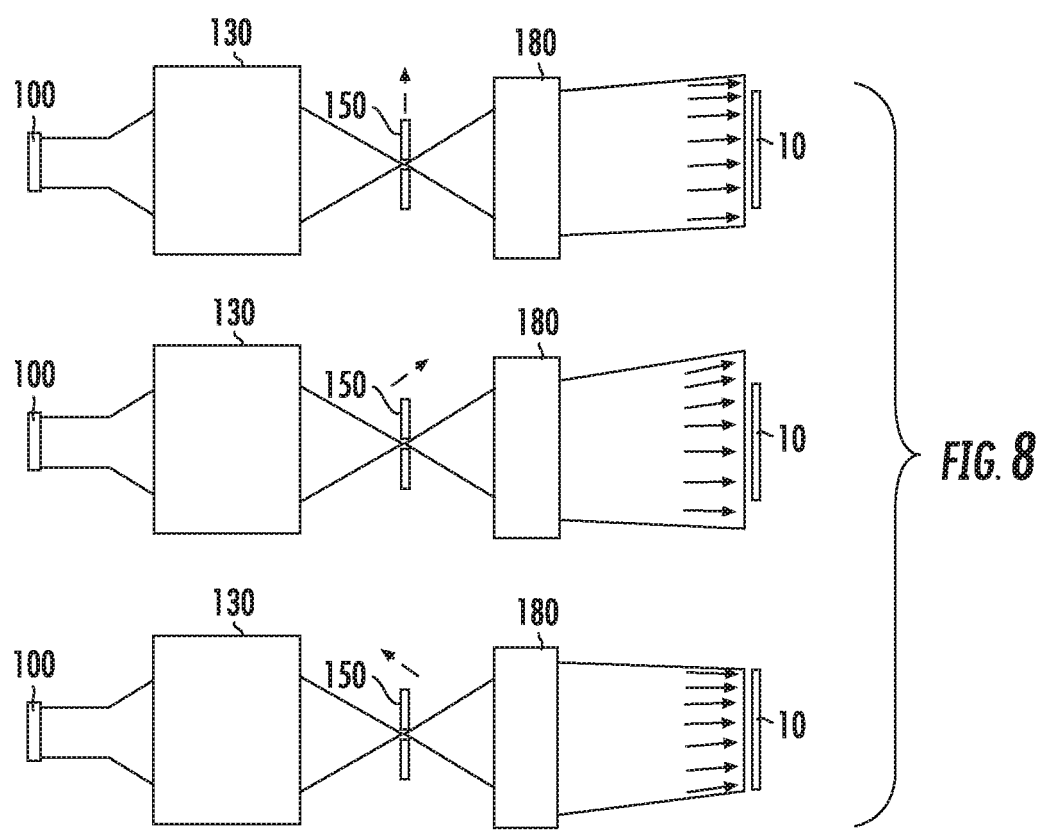
FIG. 8 shows a third application for the system of FIG. 1.

In addition, the ability to translate the mass resolving device 150 in both the X and Z directions allows for intentional generation of non-uniform ribbon ion beams. These non-uniform ribbon ion beams may potentially be useful for super-scan and selective area processing applications. FIG. 8 shows several examples of the effect of movement of the crossover point in the X direction and in both the X and Z directions. FIG. 8 shows a high level representation of the system of FIG. 1, where the mass analyzer 130, the mass resolving device 150 and the collimator 180 are shown. As shown on the top illustration, if the crossover point is moved in the X direction, a non-symmetry is introduced. For example, ion beam may have greater beam current at one end of the ribbon ion beam. However, since the crossover point is not moved in the Z direction, the resulting ion beam is made up of parallel or substantially parallel beamlets. If the mass resolving device 150 is moved in the positive Z direction and the positive X direction, as shown in the middle illustration, an asymmetric divergent ion beam may be created. Conversely, if the mass resolving device 150 is moved in the negative Z direction and the positive X direction, as shown in the bottom illustration, an asymmetric convergent ion beam may be created.

Thus, in another embodiment, the beam line ion implantation system includes a mass resolving device 150, wherein the center of the resolving aperture 151 is not aligned with the optical focal point of the collimator 180. Further, the crossover point of the desired ions is also not aligned with the optical focal point of the collimator 180, but is aligned with the center of the resolving aperture 151. The crossover point may be adjusted in order to create a particular characteristic in the ion beam. That characteristic may be any or all of the following parameters: convergence, divergence, beam current asymmetry, beam current, mean horizontal angle or horizontal angular spread.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A beam line ion implantation system, comprising:
    an ion source from which a ribbon ion beam is extracted;
    a quadrupole lens;
    a mass analyzer, wherein ions of a desired species exiting the mass analyzer cross at a crossover point;
    a collimator disposed after the crossover point;
    a current collector;
    a mass resolving device, having a resolving aperture, disposed between the mass analyzer and the collimator;
    wherein the mass resolving device is movable in a Z direction, the Z direction defined as a central trajectory of the ions travelling between the mass analyzer and the collimator and an X direction, the X direction defined as a direction of a width of the resolving aperture; and
    a controller, wherein the controller:
        analyzes parameters of a ribbon ion beam using the current collector, wherein the parameters are selected from the group consisting of beam current across a region of interest, beam mean horizontal angle and horizontal angular spread;
        determines a value of the crossover point based on the parameters;
        configures at least one of the quadrupole lens and the mass analyzer to set the crossover point; and moves the mass resolving device in the Z direction so that the center of the resolving aperture is aligned with the crossover point.

2. The beam line ion implantation system of claim 1, wherein the mass resolving device is moved in the X direction, such that a center of the resolving aperture moves in the X direction.

3. The beam line ion implantation system of claim 2, wherein the width of the resolving aperture is adjustable, and the width of the resolving aperture is adjusted independent of movement of the center of the resolving aperture.

4. The beam line ion implantation system of claim 3, wherein the mass resolving device comprises a first portion and a second portion, which are separated by the resolving aperture, and the first portion and the second portion are moved independently to adjust the width of the resolving aperture and the first portion and second portion are moved together to adjust a position of the center of the resolving aperture in the X direction.

5. The beam line ion implantation system of claim 2, wherein magnetic fields in the mass analyzer are manipulated to move the crossover point in the X direction.

6. The beam line ion implantation system of claim 5, wherein the crossover point is aligned with the center of the resolving aperture.

7. The beam line ion implantation system of claim 2, wherein beam current becomes asymmetric.

8. The beam line ion implantation system of claim 1, wherein the quadrupole lens is manipulated to move the crossover point in the Z direction.

9. The beam line ion implantation system of claim 1, wherein the center of the resolving aperture is moved toward the mass analyzer and the ribbon ion beam becomes convergent.

10. The beam line ion implantation system of claim 1, wherein the center of the resolving aperture is moved toward the collimator and the ribbon ion beam becomes divergent.

11. The beam line ion implantation system of claim 1, wherein movement of the center of the resolving aperture changes a characteristic of the ribbon ion beam, and wherein the characteristic comprises convergence, divergence, beam current asymmetry, beam current, mean horizontal angle or horizontal angular spread.

* * * * *